US008686377B2

(12) United States Patent
Twitchen et al.

(10) Patent No.: US 8,686,377 B2
(45) Date of Patent: Apr. 1, 2014

(54) DIAMOND SENSORS, DETECTORS, AND QUANTUM DEVICES

(75) Inventors: Daniel James Twitchen, Santa Clara, CA (US); Matthew Lee Markham, Oxfordshire (GB)

(73) Assignee: Element Six Limited, Ballasalla (IM)

( * ) Notice: Subject to any disclaimer, the term of this patent is extended or adjusted under 35 U.S.C. 154(b) by 0 days.

(21) Appl. No.: 14/115,031

(22) PCT Filed: May 4, 2012

(86) PCT No.: PCT/EP2012/058231
§ 371 (c)(1),
(2), (4) Date: Oct. 31, 2013

(87) PCT Pub. No.: WO2012/152685
PCT Pub. Date: Nov. 15, 2012

(65) Prior Publication Data
US 2014/0061510 A1    Mar. 6, 2014

Related U.S. Application Data

(60) Provisional application No. 61/484,550, filed on May 10, 2011.

(30) Foreign Application Priority Data

May 10, 2011    (GB) .................................. 1107730.2

(51) Int. Cl.
*B82Y 20/00*    (2011.01)

(52) U.S. Cl.
USPC .................. 250/492.1; 250/493.1; 250/504 R

(58) Field of Classification Search
CPC ................................. B82Y 20/00; C30B 29/04
USPC ............................... 250/492.1, 493.1, 504 R
See application file for complete search history.

(56) References Cited

FOREIGN PATENT DOCUMENTS

| WO | 2007-009037 A1 | 1/2007 |
| WO | WO 2007/009037 A1 * | 1/2007 |
| WO | 2010-010344 A1 | 1/2010 |

OTHER PUBLICATIONS

D'Haenens-Johansson et al., "EPR of a Defect in CVD Diamond Involving Both Silicon and Hydrogen that Shows Preferential Alignment," Phys. Rev. B, vol. 82, No. 15, 2010.

* cited by examiner

*Primary Examiner* — Michael Maskell
(74) *Attorney, Agent, or Firm* — Bryan Cave LLP

(57) ABSTRACT

A single crystal synthetic CVD diamond material comprising: a growth sector; and a plurality of point defects of one or more type within the growth sector, wherein at least one type of point defect is preferentially aligned within the growth sector, wherein at least 60% of said at least one type of point defect shows said preferential alignment, and wherein the at least one type of point defect is a negatively charged nitrogen-vacancy defect ($NV^-$).

16 Claims, 9 Drawing Sheets

DIAMOND SENSORS, DETECTORS, AND QUANTUM DEVICES

FIELD OF INVENTION

The present invention relates to synthetic chemical vapour deposited (CVD) diamond material for use in sensing, detecting and quantum processing applications.

BACKGROUND OF INVENTION

Point defects in synthetic diamond material, particularly quantum spin defects and/or optically active defects, have been proposed for use in various sensing, detecting, and quantum processing applications including: magnetometers; spin resonance devices such as nuclear magnetic resonance (NMR) and electron spin resonance (ESR) devices; spin resonance imaging devices for magnetic resonance imaging (MRI); and quantum information processing devices such as for quantum computing.

Many point defects have been studied in synthetic diamond material including: silicon containing defects such as silicon-vacancy defects (Si-V), silicon di-vacancy defects ($S_1$-$V_2$), silicon-vacancy-hydrogen defects (Si-V:H), silicon di-vacancy hydrogen defects (S-$V_2$:H); nickel containing defect; chromium containing defects; and nitrogen containing defects such as nitrogen-vacancy defects (N-V), di-nitrogen vacancy defects (N-V-N), and nitrogen-vacancy-hydrogen defects (N-V-H). These defects are typically found in a neutral charge state or in a negative charge state. It will be noted that these point defects extend over more than one crystal lattice point. The term point defect as used herein is intended to encompass such defects but not include larger cluster defects, such as those extending over ten or more lattice points, or extended defects such as dislocations which may extend over many lattice points.

The nitrogen-vacancy ($NV^-$) defect in synthetic diamond material has attracted a lot of interest as a useful quantum spin defect because it has several desirable features including:

(i) Its electron spin states can be coherently manipulated with high fidelity owing to an extremely long coherence time (which may be quantified and compared using the transverse relaxation time $T_2$);

(ii) Its electronic structure allows the defect to be optically pumped into its electronic ground state allowing such defects to be placed into a specific electronic spin state even at non-cryogenic temperatures. This can negate the requirement for expensive and bulky cryogenic cooling apparatus for certain applications where miniaturization is desired. Furthermore, the defect can function as a source of photons which all have the same spin state; and (iii) Its electronic structure comprises emissive and non-emissive electron spin states which allows the electron spin state of the defect to be read out through photons. This is convenient for reading out information from synthetic diamond material used in sensing applications such as magnetometry, spin resonance spectroscopy and imaging. Furthermore, it is a key ingredient towards using the $NV^-$ defects as qubits for long-distance quantum communications and scalable quantum computation. Such results make the $NV^-$ defect a competitive candidate for solid-state quantum information processing (QIP).

The $NV^-$ defect in diamond consists of a substitutional nitrogen atom adjacent to a carbon vacancy as shown in FIG. 1a. Its two unpaired electrons form a spin triplet in the electronic ground state ($^3A$), the degenerate $m_s=\pm 1$ sublevels being separated from the $m_s=0$ level by 2.87 GHz. The electronic structure of the $NV^-$ defect is illustrated in FIG. 1b from Steingert et al. "High sensitivity magnetic imaging using an array of spins in diamond", Review of Scientific Instruments 81, 043705 (2010). The $m_s=0$ sublevel exhibits a high fluorescence rate when optically pumped. In contrast, when the defect is excited in the $m_s=\pm 1$ levels, it exhibits a higher probability to cross over to the non-radiative singlet state ($^1A$) followed by a subsequent relaxation into $m_s=0$. As a result, the spin state can be optically read out, the $m_s=0$ state being "bright" and the $m_s=\pm 1$ states being dark. When an external magnetic field is applied, the degeneracy of the spin sublevels $m_s=\pm 1$ is broken via Zeeman splitting. This causes the resonance lines to split depending on the applied magnetic field magnitude and its direction. This dependency can be used for vector magnetometry as the resonant spin transitions can be probed by sweeping the microwave (MW) frequency resulting in characteristic dips in the optically detected magnetic resonance (ODMR) spectrum as shown in FIG. 2a from Steinert et al. Steinert et al. employed ion implantation to create a homogenous layer of negatively charged $NV^-$ centres into an ultrapure {100} type IIa diamond. The ensemble $NV^-$ sensor was found to offer a higher magnetic sensitivity due to the amplified fluorescence signal from a plurality of sensing spins. Another option is vector reconstruction since the diamond lattice imposes four distinct tetrahedral $NV^-$ orientations as shown in FIG. 2b from Steinert et al. The magnetic field projections along each of these axes can be measured as a single composite spectrum and a numerical algorithm used to reconstruct the full magnetic field vector. The magnitude (B) and orientation ($\theta_B$, $\phi_B$) of the external magnetic field can be calculated by analyzing the ODMR spectra based on an unconstrained least-square algorithm.

One major problem in producing materials suitable for quantum applications is preventing quantum spin defects from decohering, or at least lengthening the time a system takes to decohere (i.e. lengthening the "decoherence time"). A long $T_2$ time is desirable in applications such as quantum computing as it allows more time for the operation of an array of quantum gates and thus allows more complex quantum computations to be performed. A long $T_2$ time is also desirable for increasing sensistivity to changes in the electric and magnetic environment in sensing applications.

WO 2010010344 discloses that single crystal synthetic CVD diamond material which has a high chemical purity, i.e. a low nitrogen content, and wherein a surface of the diamond material has been processed to minimise the presence of crystal defects, can be used to form a solid state system comprising a quantum spin defect. Where such materials are used as a host for quantum spin defects, long $T_2$ times are obtained at room temperature and the frequency of the optical transitions used to read/write to devices are stable.

WO 2010010352 discloses that by carefully controlling the conditions under which single crystal synthetic CVD diamond material is prepared, it is possible to provide synthetic diamond material which combines a very high chemical purity with a very high isotopic purity. By controlling both the chemical purity and the isotopic purity of the materials used in the CVD process, it is possible to obtain synthetic diamond material which is particularly suitable for use as a host for a quantum spin defect. Where such materials are used as a host for quantum spin defects, long $T_2$ times are obtained at room temperature and the frequency of the optical transitions used to read/write to the devices are stable. A layer of synthetic diamond material is disclosed which has a low nitrogen concentration and a low concentration of $^{13}C$. The layer of synthetic diamond material has very low impurity levels and very low associated point defect levels. In addition, the layer of synthetic diamond material has a low dislocation density, low strain, and vacancy and self-interstitial concentrations which are sufficiently close to thermodynamic values associated with the growth temperature that its optical absorption is essentially that of a perfect diamond lattice.

In light of the above, it is evident that WO 2010010344 and WO 2010010352 disclose methods of manufacturing high quality "quantum grade" single crystal synthetic CVD diamond material. The term "quantum grade" is used herein for diamond material which is suitable for use in applications that utilize the material's quantum spin properties. For example, the quantum grade diamond material's high purity makes it possible to isolate single defect centres using optical techniques known to the person skilled in the art. The term "quantum diamond material" is also used to refer to such material.

One problem with quantum materials is that single photon emission from quantum spin defects in such materials can be very weak. For example, $NV^-$ defects in diamond exhibit a broad spectral emission associated with a Debye-Waller factor of the order of 0.05, even at low temperature. Emission of single photons in the Zero-Phonon Line (ZPL) is then extremely weak, typically of the order of a few thousands of photons per second. Such counting rates might be insufficient for the realization of advanced QIP protocols based on coupling between spin states and optical transitions within reasonable data acquisition times.

In addition to the problem of weak emission, it is evident that the high refractive index of diamond material means that due to total internal reflection very few photons can be collected within a small solid angle. Accordingly, there is a need to increase the light collection from quantum spin defects in diamond material for applications that include magnetometry and quantum information processing. In this regard, both WO 2010010344 and WO 2010010352 disclose that the quantum grade diamond material discussed therein may have a surface which has a macroscopic curvature, e.g. a lens with a radius of curvature of between about 10 μm and about 100 μm to collect and focus the light output from a quantum defect centre.

Despite the above, there is a need to further increase emission strength and/or light collection from quantum spin defects in diamond material for quantum device applications. Furthermore, for sensing applications there is a need to increase the sensitivity of quantum spin defects in quantum diamond material. Further still, for certain applications such as quantum information processing there is a need to improve the strength of coupling between two or more quantum spin defects. Finally, for certain applications there is a need to improve the directionality of the sensing and emissive functionality of the quantum spin defects in the quantum diamond material. Such developments will improve the performance of diamond quantum devices and/or aid in simplifying and miniaturizing associated device components required to perform sensing, detecting, and/or processing functionality in conjunction with the diamond quantum material. While such problems have been discussed above in relation to the $NV^-$ defect it will be appreciated that similar problems are also evident for other point defects within synthetic diamond material.

It is an aim of certain embodiments of the present invention to at least partially solve one or more of the aforementioned problems.

SUMMARY OF INVENTION

Preferential alignment of two silicon containing defects in synthetic CVD diamond material has recently been reported (see, "EPR of a defect in CVD diamond involving both silicon and hydrogen that shows preferential alignment", Physical Review B 82, 155205 (2010)). It has been suggested that such preferential orientation of defects in as-grown CVD diamond could provide a fingerprint of the growth direction, elucidate the processes occurring on the growth surface, and provide evidence for post-growth processing and/or provide an insight into defect migration mechanisms. That is, the preferential orientation of two silicon defects can be used as a means of determining how a single crystal diamond material was made and thus distinguish the material over other types of diamond material. This may be useful as a means of categorizing gems so as to distinguish, for example, treated gems from un-treated gems.

The present inventors have now found that other point defects in synthetic CVD diamond material can also be preferentially aligned, specifically the $NV^-$ defect found to be useful in quantum spin applications as previously described. Furthermore, the present inventors have found that through careful selection of a suitable substrate, careful processing of a growth surface of the substrate, and careful control of the CVD growth conditions a very high degree of point defect alignment can be achieved. Further still, the present inventors have realized that preferential alignment of point defects can be used to increase emission strength and/or light collection from point defects in synthetic CVD diamond material for sensing, detecting, and quantum device applications, increase the sensitivity of point defects in such applications, improve the strength of coupling between point defects, and improve the directionality of the sensing and emissive functionality of the point defects. Such developments can improve the performance of sensing, detecting, and quantum devices and/or aid in simplifying and miniaturizing associated device components required to perform sensing, detecting, and/or processing functionality in conjunction with synthetic CVD diamond material. These realizations allow single crystal synthetic CVD diamond material to be specifically engineered to have highly aligned defects of a desirable type for a particular application. Furthermore, these realizations allow device components to be specifically engineered to optimize the use of preferentially oriented defects. That is, a device configuration can be engineered to make maximum use of the preferential orientation of point defects within the single crystal synthetic CVD diamond material thus improving performance.

In light of the above, a first aspect of the present invention provides a single crystal synthetic CVD diamond material comprising:
  a growth sector; and
  a plurality of point defects of one or more type within the growth sector,
  wherein at least one type of point defect is preferentially aligned within the growth sector,
  wherein at least 60%, 65%, 70%, 75%, 80%, 85%, 90%, 95%, 98%, or 99% of said at least one type of point defect shows said preferential alignment, and
  wherein the at least one type of point defect is a negatively charged nitrogen-vacancy defect ($NV^-$).

According to a second aspect of the present invention there is provided a synthetic CVD diamond device component for use in a sensing, detecting or quantum spin device, said device component formed of a material as described above. In such a device component, preferably an outcoupling surface or structure is provided having a position and orientation which is formed relative to the preferentially aligned point defects to improve outcoupling of light from the point defects.

According to a third aspect of the present invention there is provided a device comprising a device component as described above. The device may comprise a light source for optically pumping one or more of the plurality of preferentially aligned point defects in the single crystal synthetic CVD diamond material. The light source may be oriented relative to the preferentially aligned point defects so as to improve coupling between the light source and the point defects.

The device may optionally comprise further components configured to interact with the preferentially aligned point defects. For example, the device may comprise a detector for detecting emission from one or more preferentially aligned point defects in the single crystal synthetic CVD diamond material. The detector may be positioned and oriented relative to the one or more preferentially oriented point defects to improve sensitivity and/or directionality of detection.

The device may optionally comprise an oscillating electromagnetic generator, such as a radio frequency or microwave generator, for manipulating one or more of the preferentially oriented point defects in the single crystal synthetic CVD diamond material. The microwave generator may be positioned and oriented relative to the one or more preferentially oriented point defects to improve coupling between the generator and the point defects. For example, in magnetometer applications, a microwave generator may be configured to scan a range of microwave frequencies for manipulating one or more of the plurality of point defects in the single crystal synthetic CVD diamond material. In spin resonance device applications a microwave generator may be configured to scan a range of microwave frequencies for manipulating one or more of the plurality of preferentially aligned point defects in the single crystal synthetic CVD diamond material, the spin resonance device further comprising a radio or microwave frequency generator configured to scan a range of frequencies for manipulating quantum spins within a sample disposed adjacent the single crystal synthetic CVD diamond material.

The device may optionally form a micro fluidic device comprising a micro fluidic channel for receiving a fluid sample, the single crystal synthetic CVD diamond material being located adjacent the microfluidic channel. The microfluidic channel and the point defects may be oriented relative to each other to improve coupling between the fluid sample and the point defects in the single crystal synthetic CVD diamond material.

The device may optionally be a spin resonance imaging device, the detector being configured to spatially resolve emission from the plurality of preferentially aligned point defects in the single crystal synthetic CVD diamond material to form a spin resonance image.

The device may optionally form a quantum information processing device. For example, a microwave generator may be configured to selectively manipulate the plurality of preferentially aligned point defects in the single crystal synthetic CVD diamond material in order to write information to the plurality of preferentially aligned point defects, the detector being configured to selectively address one or more of the plurality of preferentially aligned point defects in order to read information from the defects.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Figure 1A:
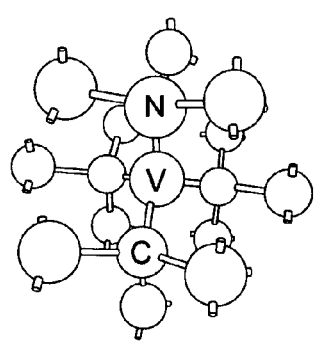
FIG. 1a illustrates the atomic structure of an $NV^-$ defect.

Embodiments of the present invention are based on the realization that through careful selection of a suitable substrate, careful processing of a growth surface of the substrate, and careful control of the CVD growth conditions a high degree of point defect alignment can be achieved in single crystal synthetic CVD diamond material and this can be used to improve sensitivity and/or directionality in sensing, detecting and quantum spin device applications.

The aforementioned single crystal CVD synthetic diamond material and device components may be manufactured by providing a single crystal diamond substrate with a growth face having a density of defects equal to or less than $5 \times 10^3$ defects/mm², preferably equal to or less than $10^2$ defects/mm², as revealed by a revealing plasma etch. The growth face may be formed from a single crystal of CVD synthetic diamond, a single crystal natural diamond, or a single crystal of HPHT synthetic diamond. Furthermore, the growth face of the single crystal diamond substrate may be selected and processed to lie within 5° of a crystallographic plane which is not a {100} crystallographic plane, particularly a {110}, {111}, or {113} crystallographic plane. For example, the growth face of the single crystal diamond substrate may be selected and processed to lie within a range 0.1° to 5°, 0.1° to 3°, 0.1° to 2°, 0.1° to 1°, or 0.5° to 1° of the desired crystallographic plane. A layer of single crystal synthetic CVD diamond material can then be grown on the growth face in the presence of a dopant containing gas, wherein growth is controlled to form of a single crystal synthetic CVD diamond material preferentially aligned NV⁻ point defects. During synthesis, the process gas for CVD growth may contain a carbon containing source gas at a concentration no greater than 5%, 4%, 3%, or 2% of the process gas. Furthermore, the growth rate is preferably controlled so as to be slow and controlled to reduce the formation of differently oriented micro-facets.

One way of achieving the preferentially aligned defects as described herein involves a multi-stage growth process. In a first stage, a single crystal diamond substrate is prepared comprising a (001) growth surface have a density of defects equal to or less than $5 \times 10^3$ defects/mm² as revealed by a revealing plasma etch. A first layer of single crystal CVD synthetic diamond is grown on the (001) growth surface. The first layer of single crystal CVD synthetic diamond is then sliced to form a {110} growth face and the {110} growth face is treated such that it possesses a density of defects equal to or less than $5 \times 10^3$ defects/mm², preferably equal to or less than $10^2$ defects/mm², as revealed by a revealing plasma etch. Thereafter a second growth stage is performed in which a layer of single crystal synthetic CVD diamond material is grown on the {110} growth face in the presence of a dopant containing gas to form a single crystal synthetic CVD diamond material with preferentially aligned NV⁻ point defects.

While the aforementioned method utilize a {110} growth face, the growth face of the single crystal diamond substrate may be selected to lie within 5° of a {110}, {111}, or {113} crystallographic plane, most preferably of a {110} crystallographic plane. As such, the preferentially aligned defects will be disposed in a {110}, {111}, or {113} growth sector within the layer of single crystal synthetic CVD diamond material, most preferably a {110} growth sector. The preferential alignment may be out-of-plane with respect to a {110}, {111}, or {113} crystallographic plane, preferably the {110} crystallographic plane. Optionally, preferential alignment is in a <111> direction out-of-plane with respect to a {110} crystallographic plane.

In addition, the preferentially aligned defects may be close to a {110}, {111}, or {113} external surface, e.g. if the layer of single crystal synthetic CVD diamond material is made thin. Most preferably, the preferentially aligned defects are close to a {110} external surface. As the external surface may not lie perfectly along a crystallographic plane, a {110}, {111}, or {113} external surface can be defined as an external surface which lies within 5° of a {110}, {111}, or {113} crystallographic plane. The preferentially aligned defects may be positioned at a distance of equal to or less than 100 μm, 50 μm, 20 μm, 10 μm, 1 μm, 500 nm, 200 nm, 50 nm, 20 nm, or 10 nm from such an oriented external surface. Such an arrangement can be advantageous in extracting photons emitted from the defects in use while lowering the number of photons which are absorbed within the layer of diamond material.

The single crystal diamond substrate may be processed such that the growth face is close to, but slightly off-cut from, said crystallographic plane. For example, it has been found that a better degree of preferential alignment of point defects within as-grown single crystal synthetic CVD diamond material can be obtained if the growth face of the single crystal diamond substrate is oriented in a range 0.1° to 5°, 0.1° to 3°, 0.1° to 2°, 0.1° to 1°, or 0.5° to 1° of the desired crystallographic plane. Although {110}, {111}, and {113} crystallographic growth surfaces have symmetry characteristics which allow preferential alignment, a {110} growth surface is considered preferable as a {111} crystallographic growth surface tends to incorporate many unwanted defects and is generally a poor surface to grow on while a {113} growth surface is difficult to prepare.

In addition to the above, it has been found that a better degree of preferential alignment of point defects can be obtained by growing the single crystal synthetic CVD diamond material at a relatively low growth rate such that point defects may be grown in as a unit in their most thermodynamically stable orientation. The specific growth rate required will vary according to the particular growth conditions, CVD chemistry, and point defect type to be preferentially aligned. For example, it has been found to be beneficial to grow the single crystal synthetic CVD diamond material using a relatively low carbon gas source (e.g. methane), e.g. no more than 5%, 4%, 3%, or 2% of the process gas. While a low carbon gas source can reduce growth rates it has been found that preferential alignment of point defects is improved. Alternatively, or additionally, it has been found to be advantageous in certain arrangements to grow the single crystal synthetic CVD diamond material at a relatively low growth temperature. In this regard, the temperature of the substrate on which the single crystal synthetic CVD diamond material is grown may be controlled such that the temperature at the growth surface of the substrate is equal to or less than 1100° C., 1050° C., 1000° C., 950° C., 900° C., 850° C., or 800° C. The temperature at the growth surface of the substrate is preferably greater than 650° C., 700° C., or 750° C. In this way it has been found that a better degree of preferential alignment of point defects can be obtained.

In relation to the above, while not been bound by theory it is believed that roughening of the growth surface during growth can produce differently oriented micro-facets and material grown on different crystal faces reduces the preferential orientation of point defects. Careful selection and preparation of the substrate and careful control of the CVD growth process can reduce the formation of differently oriented micro-facets and increase the preferential orientation of point defects.

For example, in a diamond lattice the NV⁻ centre $C_{3v}$ symmetry axis can point along any one of four <111> crystallographic axes. For QIP applications the orientation of the NV⁻ optical dipole will be important for NV⁻ cavity coupling. For magnetometry applications the highest sensitivity magnetometers will be obtained in ensemble systems in which all, or at least a majority, of NV⁻ defects are preferentially oriented. The present inventors have found that control over the NV⁻ orientation is possible for NV⁻ defects created during the CVD synthetic diamond growth process on a {110} crystallographic surface. In particular, it has been found that incorporation of NV⁻ defects in the {110} crystallographic plane can be almost completely suppressed during {110} oriented growth.

Figure 3:
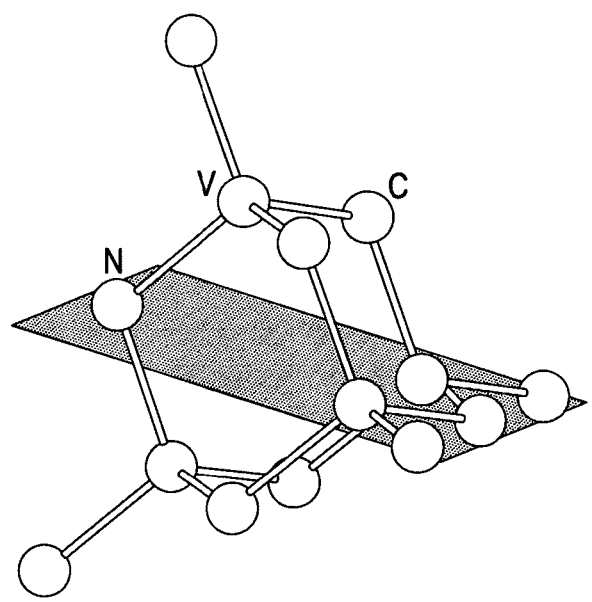
FIG. 3 illustrates a diamond unit cell with the {110} crystallographic plane shaded and showing one of the two possible in-plane $NV^-$ orientations and one of the two possible out-of-plane $NV^-$ orientations.

FIG. 3 illustrates a diamond unit cell with the {110} crystallographic plane shaded. One of the two possible in-plane NV⁻ orientations is shown together with one of the two possible out-of-plane NV⁻ orientations. The in-plane orientations are suppressed during {110} growth such that a majority of NV⁻ defects are oriented with a <111> symmetry axis out of plane with respect to the {110} growth face.

This has implications for many technologies involving NV⁻ defects as preferential orientation of the defects can increase sensitivity, coupling strength, and/or makes it easier to make devices as the direction of dipole emission is known. For example:
  (i) In bulk magnetometers the sensitivity can be improved as more defects are aligned in the same direction.
  (ii) In single defect magnetometers the NV⁻ defect can be aligned such that it can optimally couple to a nanostructure, e.g. a nanopillar.
  (iii) In quantum computers ensembles of NV⁻ defects can be resonantly coupled to super conducting qubits and the improved alignment provided by embodiments of the present invention can reduce resonance line width.
  (iv) In measurement based quantum computing schemes it is a requirement to have identical photons which necessitates identical defects including orientation of the defects.

While growth of synthetic CVD diamond material on {110} surfaces is known, the present inventors have found that growth of high quality synthetic single crystal CVD diamond material on a {110} oriented substrate is advantageous to achieve oriented defects for use in sensing, detecting, and quantum device applications. In this regard, WO 2010010344 and WO 2010010352 disclose that growth of quantum grade CVD synthetic diamond material may take place on a diamond substrate, the surface of the substrate upon which growth takes place being substantially a {100}, {110} or {111} oriented surface. It is stated that these surfaces are advantageous for the growth surface of the substrate because each of these surfaces has a low index which means that there are a minimal number of step edges in the surface. Furthermore, it is stated that a {100} oriented substrate have a (001) major face is preferred. In contrast to this stated preference, the present inventors have found that growth of high quality quantum grade single crystal synthetic CVD diamond material on a {110}, {111} or {113} oriented substrate is advantageous to achieve preferentially oriented NV⁻ defects for use in quantum device applications if the growth conditions are controlled appropriately.

The orientation of paramagnetic point defects in synthetic CVD diamond material can be analysed using electron paramagnetic resonance (EPR) spectroscopy. By taking spectra at different orientations it is possible to determine whether preferential alignment of particular point defects has occurred and to what extent. For example, by taking EPR spectra parallel and perpendicular to a <110> growth surface of a single crystal synthetic CVD diamond material grown in accordance with an embodiment of the present invention it is possible to determine that substantially all the NV⁻ defects are oriented with a <111> symmetry axis out of plane with respect to the {110} growth face, i.e. in the <111> or <−1−11> directions, and substantially no NV⁻ defects are incorporated with a <111> symmetry axis in the growth plane, i.e. in the <−11−1> or <1−1−1> directions. In this case, the preferential orientation is a <111> direction (<111> or <−1−11>) out of plane with respect to the growth surface as measured by EPR analysis such that at least 60%, 65%, 70%, 75%, 80%, 85%, 90%, 95%, 98%, or 99% of the NV⁻ defects lying out of the growth plane in a <111> direction.

While the aforementioned measurement technique does not make it possible to distinguish between the two out of plane orientations in the <111> and <−1−11> directions, through their understanding of growth mechanisms at the growth surface the inventors believe that this result in essence means that >99.7% of all NV⁻ defects are grown by an incorporated N atom with a grown in vacancy out of the growth plane.

While such effects are not usually observed for NV⁻ defects when synthetic CVD diamond material is grown on a {100} growth surface, through their knowledge of growth mechanisms at the growth surface the present inventors believe that similar effects may also be observed using a {111} or {113} growth surface and for other point defect types. Indeed, similar effects have already being observed by the inventors for NVH⁻ defects and for several silicon containing defects including $SiV^0$, $SiV^-$, and the $SiV_2H^0$ defect. Careful preparation of the substrate and careful control of the growth conditions allows the level of preferential orientation to be increased by reducing the formation of differently oriented micro-facets. The following discussion clarifies what we mean by "preferential orientation".

In a crystal one encounters chemically identical defects (or colour centres) occurring at different orientations. Each of these differently oriented defects may be generated from one member of the set using the operations appropriate to the symmetry of the defect which cannot be higher than the symmetry of the crystal. These symmetry-related copies can be referred to as "symmetry related sites".

Each of these copies may give rise to distinct contributions to defect related properties including optical absorption, optical emission, electron paramagnetic resonance spectra and other optical, electrical and mechanical properties.

If the probability of any one of the differently oriented defects existing is equal to the reciprocal of the number of different symmetry related sites then there is no bias for or against any particular defect orientation; the defects are said to be randomly oriented over the available symmetry related sites. However, if this is not the case and a specific defect orientation or sub-set of the possible defect orientations is favoured over others then the defects are said to be preferentially oriented. The amount of preferential alignment depends on the distribution of defects over the available sites. If all the chemically identical defects are aligned in only one of the set of symmetry related sites then the defects may be described as completely preferentially oriented. Even preferential orientation over a subset of symmetry related sites may be useful since for a particular application this subset may behave in the same manner as a completely preferentially oriented system. Examples of how preferential orientation can be calculated for defects having different symmetries are given below for illustrative purposes.

Example 1

$D_{2d}$

In a crystal with $T_d$ symmetry there are three possible symmetry related sites (orientations) of a defect with $D_{2d}$ symmetry. If all symmetry related sites are equally probably then the defect is randomly oriented.

If the probability of finding one particular site is n (where $0 \leq n \leq 1$) and that for each of the other two $(1-n)/2$ then the degree of preferential orientation can vary between completely preferentially oriented (n=1; 100% preferentially aligned), randomly oriented (n=⅓; 0% preferentially aligned) to oriented with equal probability in only two of the three possible symmetry related sites (n=0).

If the probabilities of occupancy of the three possible symmetry related sites are all different, say n, $(1-n-p)/2$ and $(1-n+p)/2$ then all possibilities for different distributions amongst the three symmetry related sites are bounded by the lines $0 \leq n \leq 1$, $p \geq 0$ and $n+p \leq 1$.

Example 2

$C_{3v}$

Four directions along which the trigonal axis of a symmetry related site can be oriented: [111], [$\bar{1}\bar{1}1$], [1$\bar{1}\bar{1}$] and [$\bar{1}1\bar{1}$] (and their inverses if the defect does not posses inversion symmetry) and labelled a, b, c, d Consider growth direction along [001]:

The symmetry axes of the sites (a), (b), (c) and (d) make equal angles with respect to the growth direction (arccos $(rl;\sqrt{1/3}rlx)$). No preferential orientation (0% preferential alignment) of trigonal defects is expected for growth along the [001]. The same argument applies for growth along all $\langle 100 \rangle$ directions.

Consider growth direction along [110]:

The symmetry axes of the sites (a) and (b) make equal angles with respect to the growth direction (arccos $(rl;\sqrt{2/3}rlx)$). The symmetry axes of the sites (c) and (d) make equal angles with respect to the growth direction (90°).

Thus sites (a) and (b) can be treated as equivalent and sites (c) and (d) treated as equivalent.

If the probability of finding either site (a) or (b) site is n/2 (where $0 \leq n \leq 1$) and that for either site (c) and (d) is (1−n)/2 then the degree of preferential orientation can vary between completely preferentially oriented (n=1) in sites (a) and (b), randomly oriented (n=½; 0% preferentially aligned) to completely preferentially oriented (n=0; 100% preferentially aligned) in sites (c) and (d) (or away from sites (a) and (b)).

For $0 \leq n \leq ½$ the degree of preferential orientation in sites (c) and (d) can be specified as: $(1-n/(1-n)) \times 100\%$ For $½ \leq n \leq 1$ the degree of preferential orientation in sites (a) and (b) can be specified as: $(1-(1-n)/n) \times 100\%$ The same argument for growth along all $\langle 110 \rangle$ directions but with different symmetry related sites being paired as equivalent.

Consider growth direction along [111]:

The symmetry axes of the sites (a) makes an angle to the growth direction of 0°. The symmetry axes of the sites (b), (c) and (d) make equal angles with respect to the growth direction (arccos(⅓)). Thus site (a) is unique and sites (b), (c) and (d) treated as equivalent.

If the probability of finding either site (a) is n (where $0 \leq n \leq 1$) and that for either site (b), (c) or (d) is (1−n)/3 then the degree of preferential orientation can vary between completely preferentially oriented (n=1; 100% preferentially aligned) in site (a), randomly oriented (n=¼; 0% preferentially aligned) to completely preferentially oriented (n=0) away from site (a).

For $¼ \leq n \leq 1$ the degree or preferential orientation in site (a) can be specified as: $(1-(1-n)/3n) \times 100\%$ For $0 \leq n \leq ¼$ the degree or preferential orientation away from site (a) can be specified as: $(1-3n/(1-n)) \times 100\%$ The same argument applies for growth along all $\langle 111 \rangle$ directions but with different symmetry related sites being paired as equivalent.

In light of the above, the inventors have shown that it is possible to achieve high degrees of preferential orientation of NV⁻ defects grown on non-{100} crystallographic surfaces such as {100}, {111} and {113} crystallographic surfaces. The underlying theory for achieving such preferential orientation does not apply to {100} crystallographic surfaces. However, surprisingly the present inventors have managed to achieve a similar preferential orientation effect by growing on {100} crystallographic surfaces. In this regard, it has been noted that under certain conditions the growing single crystal CVD synthetic diamond surface is not flat but rather comprises a series of terraces and risers as is known in the art. The risers lie out of the substrate growth plane and have a crystallographic component which differs from the primary crystallographic component of the substrate growth plane. As such, for growth on a {100} crystallographic surface, the risers have a non-{100} crystallographic component. It has been found that these risers show preferential orientation of NV⁻ defects for the reasons previously given. In light of this finding, the present inventors have realised that if growth on {100} crystallographic surfaces can be modified to increase the size/area of risers formed during the growth process then a relatively high degree of preferential orientation can be achieved even when the primary {100} crystallographic surface does not show preferential orientation of NV⁻ defects. This is counter to the view that very large risers are not usually desirable in single crystal CVD synthetic diamond growth.

The percentage of riser surface area versus terrace surface area can be increased by changing the growth temperature and by changing the growth chemistry. For example, varying the methane content in the CVD synthesis atmosphere has been found to change the riser surface area and this effect can be used to increase the preferential orientation of NV⁻ point defects. Furthermore, varying the growth temperature has been found to change the riser surface area and this effect can also be used to increase riser surface area and increase the preferential orientation of NV⁻ point defects. As such, by carefully controlling growth conditions it is also possible to achieve a relatively high degree of preferential orientation of NV⁻ defects grown on {100} crystallographic surfaces in addition to {100}, {111} and {113} crystallographic surfaces. As such, according to certain embodiments the preferentially aligned point defects may lie in a {100} growth sector of the single crystal synthetic CVD diamond material. Furthermore, the preferential alignment may be out-of-plane with respect to a {100} crystallographic plane. Further still, the preferentially aligned point defects may lie within 100 μm of an external surface of the single crystal synthetic CVD diamond material, said external surface being a {100} surface.

Unlike the prior art disclosure in Physical Review B 82, 155205 (1010) which merely suggests that preferential orientation of point defects in as-grown CVD diamond could provide a fingerprint of the growth direction, growth processes, and evidence for post-growth processing, the present inventors have realized that preferential orientation of point defects can be utilized to improve the performance of device components for sensing, detecting, and quantum applications and that high levels of preferential orientation can be achieved for use in such applications by careful control of growth conditions. In such device components, point defects can be provided in a preferential orientation relative to a crystallographic growth sector of synthetic CVD diamond material as previously described. In addition, it is possible to form other features into the device components so that they are suitably aligned relative to the point defects in order to improve sensitivity, directionality, and/or outcoupling. A synthetic single crystal CVD diamond component may be formed by cutting the material into a suitable shape according to the desired application with one or more surfaces of the component oriented in a desired manner relative to the preferentially oriented point defects. For example, a lens or other outcoupling structure may be formed such that the position and orientation of the outcoupling structure relative to the preferential orientation of the point defects improves outcoupling of light emitted by the point defects in use. Similarly, in-coupling surfaces or structures may be positioned and oriented relative to the point defects so as to improve coupling between an external stimulus and the point defects. For example, a channel may be formed in the device component for receiving a fluid sample and the point defects may be preferentially oriented relative to the channel orientation so as to increase coupling between the sample and the point defects.

The single crystal synthetic CVD diamond material may have one or more of: a neutral single substitutional nitrogen concentration equal to or less than 20 ppb, 10 ppb, 5 ppb, 1 ppb or 0.5 ppb; an $NV^-$ concentration equal to or less than 0.15 ppb, 0.1 ppb, 0.05 ppb, 0.001 ppb, 0.0001 ppb or 0.00005 ppb or an $NV^-$ concentration equal to or greater than 0.1 ppm, 0.5 ppm, 1.0 ppm, 2.0 ppm, 3 ppm, 4 ppm or 5 ppm; and a total concentration of $^{13}C$ equal to or less than 0.9%, 0.7%, 0.4% 0.1%, 0.01%, or 0.001%. The use of high purity quantum grade single crystal CVD synthetic diamond material improves the decoherence time of the one or more quantum spin defects within the diamond material and makes it possible to isolate single defect centres using optical techniques known to the person skilled in the art. The material may fall into one of two categories depending on the desired end use: low $NV^-$ concentration material or high $NV^-$ concentration material.

The single crystal synthetic CVD diamond material may have at least one dimension equal to or greater than 0.1 mm, 0.5 mm, 1 mm, 2 mm, or 3 mm. Furthermore, the single crystal synthetic CVD diamond material may form a layer having a thickness equal to or greater than 0.1 µm, 1 µm, 10 µm, 100 µm, 200 µm, or 500 µm. The specific size and dimensions of the single crystal synthetic CVD diamond material will to some extent be dependent on the device configuration and its intended use. However, for many applications the single crystal synthetic CVD diamond material may need to be sufficiently large to contain enough point defects to improve sensitivity while the distribution of the point defects is sufficiently dispersed to improve the decoherence time of the point defects and/or make it possible to isolate single defect centres using optical techniques.

The point defects may have a decoherence time $T_2$ equal to or greater than 0.05 ms, 0.1 ms, 0.3 ms, 0.6 ms, 1 ms, 5 ms, or 15 ms, with corresponding $T_2^*$ values equal to or less than 800 µs, 600 µs, 400 µs, 200 µs, 150 µs, 100 µs, 75 µs, 50 µs, 20 µs, or 1 µs.

The point defects may be positioned at a distance from a surface of the single crystal synthetic CVD diamond equal to or less than: 100 nm; 80 nm; 50 nm; 20 nm; or 10 nm. It can be advantageous that the point defects are positioned close to the surface in order to increase sensitivity to changes in the magnetic or electric field adjacent the surface.

The single crystal synthetic CVD diamond material may form a layer which can be disposed within a single crystal CVD synthetic diamond. The single crystal CVD synthetic diamond may be composed entirely of the layer or the layer may form only a portion of the single crystal CVD synthetic diamond. For example, the single crystal CVD synthetic diamond may comprise a layer of quantum grade material having preferentially aligned point defects and one or more layers of lower grade material having more impurities. This arrangement can be useful as it is easier and cheaper to form thicker layers of lower grade material.

The aforementioned approach can be particularly useful in order to achieve a cost effective route towards the provision of an out-coupling structure in the single crystal CVD synthetic diamond. Out-coupling structures formed at a surface of the single crystal CVD synthetic diamond are useful for increasing out-coupling of light and increasing light collection from point defects in the synthetic diamond material. In one type of arrangement, the out-coupling structure is formed in a surface of the single crystal CVD synthetic diamond whereby the out-coupling structure is integrally formed by the surface of the single crystal CVD synthetic diamond. In order to form such an integrated out-coupling structure, more diamond material may be required and at least a portion of this additional material can optionally be made of a lower grade than the layer comprising the quantum spin defects utilized in quantum applications. Suitable out-coupling structures include one or more of: a convex surface; a microlens array; a solid immersion lens (SIL); a plurality of surface indentations or nano-structures; a diffraction grating; a fresnel lens; a nanowire; and a coating such as an antireflective coating.

Figure 4:
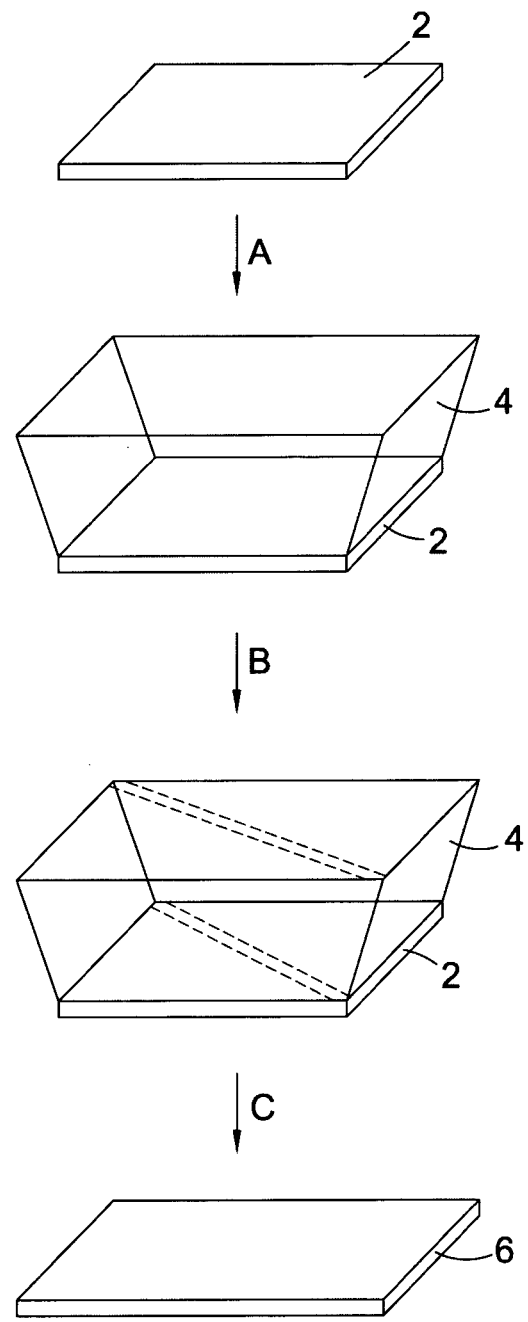
FIG. 4 shows a method of making a {110} oriented layer of single crystal CVD synthetic diamond material for use in a diamond quantum device according to an embodiment of the present invention.
Figure 4:
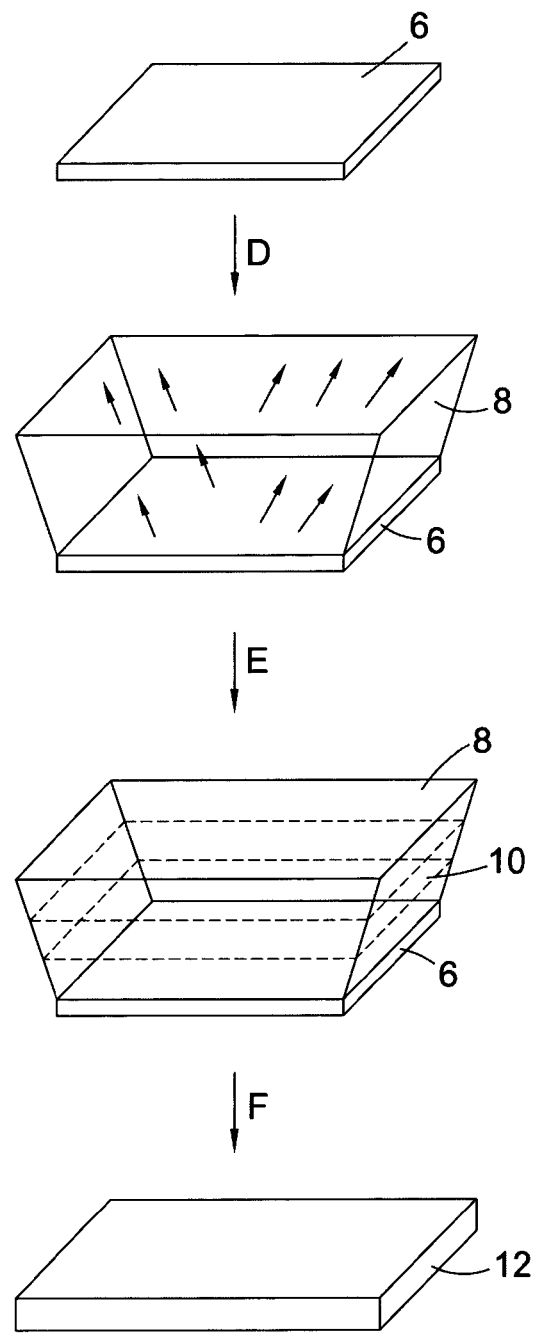

FIG. 4 illustrates the method steps involved in forming a layer of CVD synthetic diamond material having oriented $NV^-$ for use in a diamond quantum device in accordance with an embodiment of the present invention. Initially, a (001) single crystal diamond substrate 2 is provided. This may be formed of a natural, HPHT, or CVD synthetic diamond material. Although each of these different types of diamond material have their own distinct features and are thus identifiable as distinct, the key feature for this substrate is that the growth surface is carefully prepared to have a good surface finish.

By good surface finish, we mean a surface having a density of defects equal to or less than $5 \times 10^3$ defects/mm$^2$ as revealed by a revealing plasma etch. The defect density is most easily characterised by optical evaluation after using a plasma or chemical etch optimised to reveal the defects (referred to as a revealing plasma etch), using for example a brief plasma etch of the type described below.

Two types of defects can be revealed:
1) Those intrinsic to the substrate material quality. In selected natural diamond the density of these defects can be as low as 50/mm$^2$ with more typical values being $10^2$/mm$^2$, whilst in others it can be $10^6$/mm$^2$ or greater.
2) Those resulting from polishing, including dislocation structures and microcracks forming chatter tracks along polishing lines. The density of these can vary considerably over a sample, with typical values ranging from about $10^2$/mm$^2$, up to more than $10^4$/mm$^2$ in poorly polished regions or samples.

The preferred low density of defects is such that the density of surface etch features related to defects is below $5 \times 10^3$/mm$^2$, and more preferably below $10^2$/mm$^2$. It should be noted that merely polishing a surface to have low surface roughness does not necessarily meet these criteria as a revealing plasma etch exposes defects at and just underneath the surface. Furthermore, a revealing plasma etch can reveal intrinsic defects such as dislocations in addition to surface defects such as microcracks and surface features which can be removed by simple polishing.

The defect level at and below the substrate surface on which the CVD growth takes place may thus be minimised by careful selection and preparation of the substrate. Included here under "preparation" is any process applied to the material from mine recovery (in the case of natural diamond) or synthesis (in the case of synthetic material), as each stage can influence the defect density within the material at the plane which will ultimately form the substrate surface when preparation as a substrate is complete. Particular processing steps may include conventional diamond processes such as mechanical sawing, lapping and polishing (in this application specifically optimised for low defect levels), and less conventional techniques such as laser processing, reactive ion etching, ion beam milling or ion implantation and lift-off techniques, chemical/mechanical polishing, and both liquid chemical processing and plasma processing techniques. In addition, the surface $R_Q$ measured by stylus profilometer, preferably measured over a 0.08 mm length, should be minimised, typical values prior to any plasma etch being no more than a few nanometers, i.e. less than 10 nanometers. $R_Q$ is the root mean square deviation of surface profile from flat (for a Gaussian distribution of surface heights, $R_Q$=1.25 Ra. For definitions, see for example "Tribology: Friction and Wear of Engineering Materials", IM Hutchings, (1992), Publ. Edward Arnold, ISBN 0-340-56184).

One specific method of minimising the surface damage of the substrate is to include an in situ plasma etch on the surface on which the homoepitaxial diamond growth is to occur. In principle this etch need not be in situ, nor immediately prior to the growth process, but the greatest benefit is achieved if it is in situ, because it avoids any risk of further physical damage or chemical contamination. An in situ etch is also generally most convenient when the growth process is also plasma based. The plasma etch can use similar conditions to the deposition or diamond growing process, but with the absence of any carbon containing source gas and generally at a slightly lower temperature to give better control of the etch rate. For example, it can consist of one or more of the following:

(i) An oxygen etch using predominantly hydrogen with optionally a small amount of Ar and a required small amount of $O_2$. Typical oxygen etch conditions are pressures of $50\text{-}450\times10^2$ Pa, an etching gas containing an oxygen content of 1 to 4 percent, an argon content of 0 to 30 percent and the balance hydrogen, all percentages being by volume, with a substrate temperature 600-1100° C. (more typically 800° C.) and a typical duration of 3-60 minutes.

(ii) A hydrogen etch which is similar to (i) but where the oxygen is absent.

(iii) Alternative methods for the etch not solely based on argon, hydrogen and oxygen may be used, for example, those utilising halogens, other inert gases or nitrogen.

Typically the etch consists of an oxygen etch followed by a hydrogen etch and then moving directly into synthesis by the introduction of the carbon source gas. The etch time/temperature is selected to enable remaining surface damage from processing to be removed, and for any surface contaminants to be removed, but without forming a highly roughened surface and without etching extensively along extended defects such as dislocations which intersect the surface and thus cause deep pits. As the etch is aggressive, it is particularly important for this stage that the chamber design and material selection for its components be such that no material is transferred by the plasma from the chamber into the gas phase or to the substrate surface. The hydrogen etch following the oxygen etch is less specific to crystal defects rounding off the angularities caused by the oxygen etch which aggressively attacks such defects and providing a smoother, better surface for subsequent growth.

Having suitably prepared the growth surface of the (001) single crystal diamond substrate 2 as illustrated in FIG. 4, Step A involves CVD growth of a layer of (001) oriented single crystal CVD synthetic diamond material 4 on the substrate 2.

In Step B, the layer of (001) oriented single crystal CVD synthetic diamond material 4 is vertically sliced along a diagonal (indicated by the dotted lines in FIG. 4) to yield a {110} single crystal diamond plate 6 as illustrated in Step C. This may be achieved using a laser. The {110} single crystal diamond plate 6 may then be used as a substrate on which a layer of {110} oriented single crystal CVD synthetic diamond material 8 is grown as shown in Step D.

The growth surface of the {110} substrate 6 may be treated in a similar manner as described in relation to the (001) substrate to obtain a good surface finish prior to growth of the {110} oriented single crystal CVD synthetic diamond material 8. By good surface finish, again we mean a surface having a density of defects equal to or less than $5\times10^3$ defects/mm$^2$ and more preferably below $10^2$/mm$^2$ as revealed by a revealing plasma etch.

Growth on the {110} single crystal plate 6 may be performed under conditions to yield high purity quantum grade CVD synthetic diamond material and are discussed in more detail below.

After growth, the {110} oriented layer of single crystal CVD synthetic diamond material 8 can be horizontally sliced as shown in Step E to yield a free standing {110} oriented layer of single crystal CVD synthetic diamond material as shown in Step F.

At least a portion of the quantum diamond component can be grown using a gas phase having a nitrogen concentration of less than or equal to 250 parts per billion, 200 parts per billion, 150 parts per billion, or 120 parts per billion, calculated as molecular nitrogen. The decreased nitrogen content in the gas within the CVD reactor results in a decreased nitrogen content within the CVD diamond material, and therefore a lower absorption coefficient and longer decoherence times. The nitrogen content within the CVD reactor gas may be more than 0.001 parts per billion, more than 0.01 parts per billion, more than 0.1 parts per billion, more than 1 part per billion, or more than 10 parts per billion.

The CVD growth process may use source gases of high isotopic purity in addition to high chemical purity. For example the carbon source gas may have a $^{12}C$ fraction increased so as to be equal to or greater than 99%, 99.3%, 99.6%, 99.9%, 99.99%, or 99.999%. This can further increase the decoherence time of the single photon emitters although it is also envisaged that a natural abundance of $^{12}C$ may be used.

In light of the above, the quantum diamond component may be formed of a diamond material having at least one high purity portion comprising one or more of: a neutral single substitutional nitrogen concentration equal to or less than 20 ppb, 10 ppb, 5 ppb, 1 ppb or 0.5 ppb; an NV$^-$ concentration equal to or less than 0.15 ppb, 0.1 ppb, 0.05 ppb, 0.001 ppb, 0.0001 ppb, or 0.00005 ppb; and a total concentration of $^{13}C$ equal to or less than 0.9%, 0.7%, 0.4% 0.1%, 0.01%, or 0.001%.

The gas composition used in the CVD growth process might also include other impurities related to the formation of colour centres or their charge stabilization such as, for example, silicon or phosphorous. However, according to certain embodiments in addition to low nitrogen concentrations, the CVD growth process preferably also uses a gas composition which has very low concentrations of other impurities which may be incorporated into the diamond material during CVD growth. Accordingly, at least a portion of the diamond material preferably has one or more of: a boron concentration of 100 ppb or less; a silicon concentration of 100 ppb or less; a concentration of paramagnetic defects of 1 ppm or less; a concentration of any single non-hydrogen impurities of 5 ppm or less; a total impurity content excluding hydrogen and its isotopes of 10 ppm or less; and a concentration of hydrogen impurities in the single crystal diamond host material of $10^{18}$ cm$^{-3}$ or less. The high purity material preferably also has a low concentration of dislocations. For example, the high purity single crystal diamond material may contain a dislocation bundle density equal to or less than: $10^6$ dislocations cm$^{-2}$; $10^4$ dislocations cm$^{-2}$; $3\times10^3$ dislocations cm$^{-2}$; $10^3$ dislocations cm$^{-2}$; $10^2$ dislocations cm$^{-2}$; or 10 dislocations cm$^{-2}$. This can be achieved by careful substrate preparation and the use of nitrogen to inhibit the formation of dislocations which could otherwise propagate through the high purity diamond material.

It is also desirable to process a surface of the diamond material so as to achieve a low surface roughness Rq. As described in WO 2010010344 and WO 2010010352, high $T_2$ values and high spectral stability can be obtained using the synthetic diamond material of the present invention as a host material where the quantum spin defect is to be positioned at a distance of equal to or less than 100 µm from such a processed surface. According to embodiments of the present invention the quantum spin defect may optionally be positioned at a distance of equal to or less than 100 µm, preferably 50 µm, preferably 20 µm, preferably 10 µm, preferably 1 µm, preferably 500 nm, preferably 200 nm, preferably 50 nm, preferably 20 nm, or preferably 10 nm from such a processed surface. This positioning of the quantum spin defect means that it is readily accessible for end applications such that it can be characterised and "read out", for example, by optical coupling to a waveguide. Thus, it is advantageous to form a quantum spin defect in the quantum grade single crystal diamond, wherein a surface of the diamond material is processed such that the surface roughness, Rq of the single crystal diamond within an area defined by a circle of radius of about 5 µm centred on the point on the surface nearest to where the quantum spin defect is formed is equal to or less than about 10 nm, 5 nm, 1 nm, or 0.5 nm.

In additional to low surface roughness at a surface near a quantum spin defect, it is also useful to ensure that sub-surface damage is low near a quantum spin defect. Sub-surface damage may be reduced by etching, such as with a plasma etch, and polishing. It may also be useful to control the type of surface termination at a diamond surface near the quantum spin defect to ensure that the diamond is not terminated with a species which will adversely interact with the quantum spin defect. For example, it may be useful to ensure that the diamond surface near the quantum spin defect is terminated with a spin-zero species such as oxygen, rather than a species which has a non-zero spin such as hydrogen or those species which might lead to some surface charge redistribution processes (such as that known to occur with hydrogen).

The quantum diamond component may be formed using a multi-stage growth process whereby the quantum diamond component has both lower quality and higher quality diamond material disposed therein with the one or more quantum spin defects disposed in the higher quality diamond material. For example, a first layer of single crystal diamond material may be grown using a gas phase having a nitrogen concentration of greater than or equal to 300 parts per billion (ppb) and less than or equal to 5 parts per million (ppm), calculated as molecular nitrogen. A second layer may be grown using a gas phase having a nitrogen concentration of greater than or equal to 0.001 ppb and less than or equal to 250 ppb, calculated as molecular nitrogen. The second layer may also be grown using a gas phase having a carbon source gas comprising $^{12}C$ in a natural abundance or in an amount of at least 99% of the total C content of the carbon source gas. The second layer may comprise high purity quantum grade diamond material as previously discussed. One or more quantum spin defects may be formed in the second layer by in situ growth.

In relation to the above, one particular preferred example involves using a two layer growth process in which the first layer is 'normal' high quality diamond material and then subsequently a layer comprises high defect alignment is grown thereon in the same reactor chamber. This may be achieved by altering the process gas composition and growth temperature to switch between the first and second growth processes, e.g. by lowering the concentration of carbon containing gas and/or lowering the growth temperature at the surface of the substrate. By forming both layers in a continuous process then a boundary interface between the layers is substantially free of impurities. An interface substantially free of impurities may be defined as an interface where, in a region either side of the interface extending to 20%, 50%, or 100% of a thickness of the doped layer, the impurity concentration does not exceed $10^{14}$, $3\times10^{14}$, $10^{15}$, $3\times10^{15}$, $10^{16}$, $3\times10^{16}$, or $10^{17}$, and does not vary in concentration by more than a factor of 2, 3, 5, 10, 30, 100, 300, or 1000. Multiple profile measurements may be taken across an interface to show that this criteria is met across substantially all the interface, e.g. a measurement may be made 1, 2, 3, 5, or 10 times at 1 mm spacings along a line across the interface with all measurements meeting the required criteria. Typical impurities will comprise nitrogen and silicon. As such, a thin layer (e.g. thickness between 10 nm and 1 mm) of high defect alignment single crystal diamond material can be formed on a supporting single crystal diamond layer which has a lower degree of defect alignment. Furthermore, the interface between the two layers is a high purity interface to prevent impurities from interacting with the preferentially oriented defects, e.g. by dipole spin coupling.

A high-purity single crystal CVD synthetic diamond layer has been grown on a {110} oriented diamond substrate as previously described. Single NV$^-$ centres could be resolved in scanning confocal images. In order to determine NV$^-$ orientation, images were obtained for nine different linear excitation polarizations. If the surface normal is defined as [110], the linear polarization is varied from 0 to 160 degrees in equal steps with polarization angle 0 corresponding to [001]. The excitation polarization dependence can be used to distinguish between different NV$^-$ orientations. In particular, it is possible to distinguish between the two in-plane centres which have a markedly different polarization dependence than the out-of-plane centres. It was found that the majority of NV$^-$ defects were oriented out-of-plane with respect to the [110] growth surface.

Figure 5:
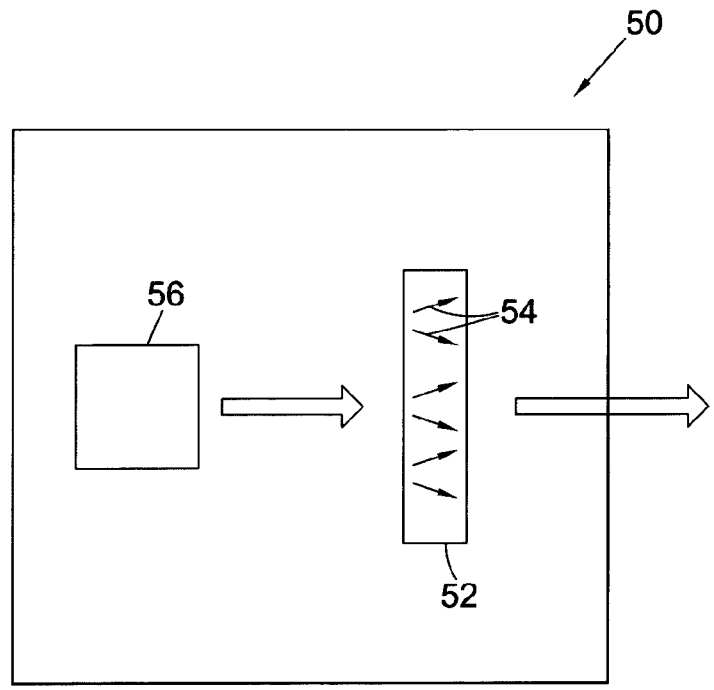
FIG. 5 shows a schematic diagram of a spin resonance device according to an embodiment of the present invention.

Synthetic CVD diamond device components as previously described can be used to form a diamond quantum device. An example of such a device is illustrated in FIG. 5. The quantum device 50 comprises a diamond quantum component 52 formed of a layer of single crystal CVD synthetic diamond 52 which has major faces in a {110} orientation. The layer comprises NV$^-$ defects 54 which are preferentially oriented as previously described. The quantum device also comprises a light source 56 for optically pumping one or more of the plurality of quantum spin defects 54 in the layer 52.

The light source 56 is tuned to an appropriate frequency to excite the NV$^-$ defect into undergoing an electron transition as illustrated in FIG. 1(a). The electronic structure of the defect allows the defect to be optically pumped into its electronic ground state allowing such defects to be placed into a specific electronic spin state even at non-cryogenic temperatures. This can negate the requirement for expensive and bulky cryogenic cooling apparatus for certain applications where miniaturization is desired. Further transitions and subsequent decay and fluorescent emission will result in the emission of a photon which all having the same spin state. As such, this device configuration can function as a source of photons which all having the same spin state which is useful for further quantum processing applications based on photonics. The NV$^-$ defects can be oriented relative to one or more surfaces of the diamond quantum component and relative to the light source to achieve strong excitation and good out-coupling.

Figure 6:
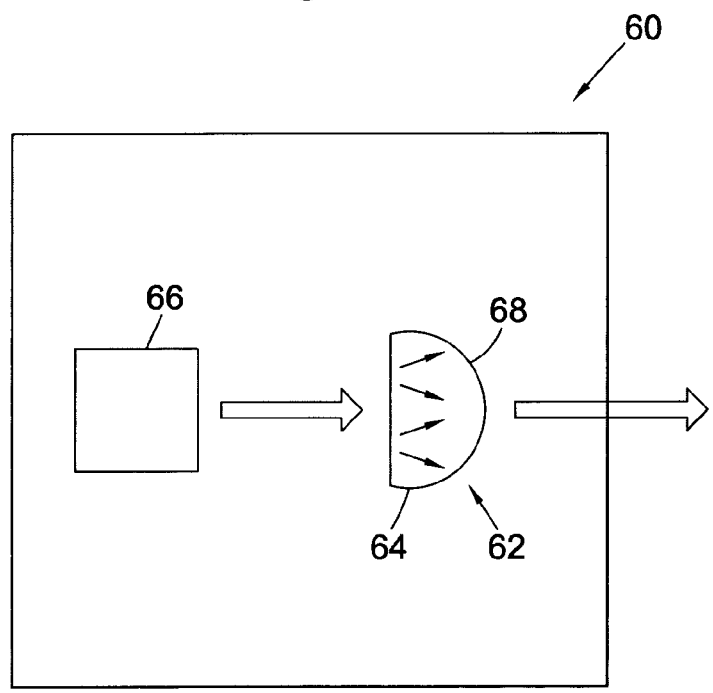
FIG. 6 shows a schematic diagram of a spin resonance device according to another embodiment of the present invention.

FIG. 6 shows a similar diamond quantum device 60. This device 60 also comprises a diamond quantum component 62 including a layer of single crystal CVD synthetic diamond 64 oriented in a {110} configuration. The layer 64 comprises NV⁻ defects which are preferentially oriented as previously described. The quantum device also comprises a light source 66 for optically pumping one or more of the plurality of quantum spin defects in the layer 64.

The diamond quantum device 60 shown in FIG. 6 differs from that shown in FIG. 5 in that the single crystal CVD synthetic diamond component 62 has been formed to have an out-coupling structure 68 to increase light output from the emitting NV⁻ defects. In the illustrated arrangement the single crystal CVD synthetic diamond component 60 has been formed into a solid immersion lens. This lens may be formed entirely from a {110} oriented layer of quantum grade material or may be a composite structure in which the {110} oriented layer of quantum grade material is disposed. For example, the single crystal CVD synthetic diamond component 62 may be composed of a single crystal of synthetic CVD diamond material comprising the {110} oriented layer of quantum grade material and one or more further layers of material of a lower grade.

Figure 7:
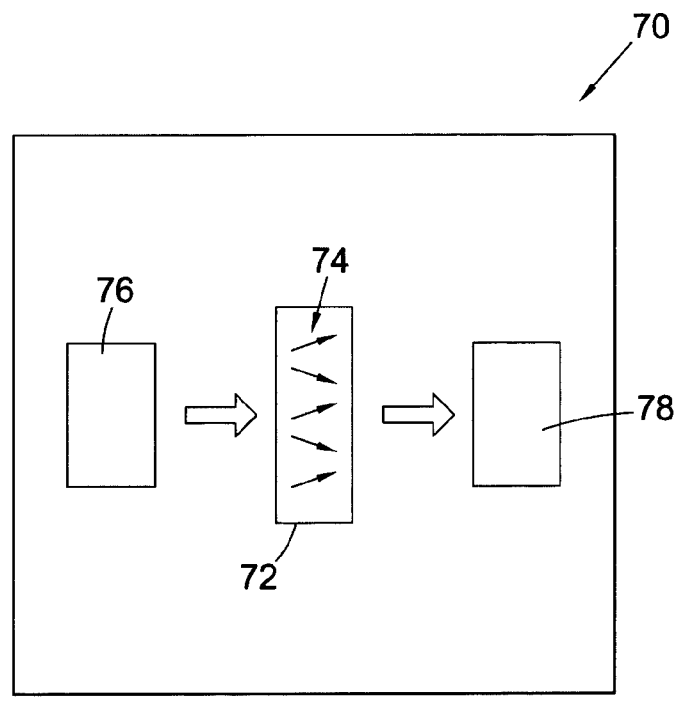
FIG. 7 shows a schematic diagram of a spin resonance device according to another embodiment of the present invention.

FIG. 7 shows another example of a diamond quantum device 70. This device includes a single crystal CVD synthetic diamond component 72 having a {110} orientation with preferentially oriented NV⁻ defects 74 and a light source 76 as previously described. The device 70 differs from that illustrated in FIGS. 5 and 6 in that it further comprises a detector 78 for detecting emission from one or more decaying quantum spin defects 74 in the single crystal CVD synthetic diamond component 72.

In this device configuration, any perturbation of the NV⁻ defects which results in an electron transition to a $m_s=\pm 1$ state will result in a reduction in fluorescent emission which can then be detected by the detector 78.

Figure 8:
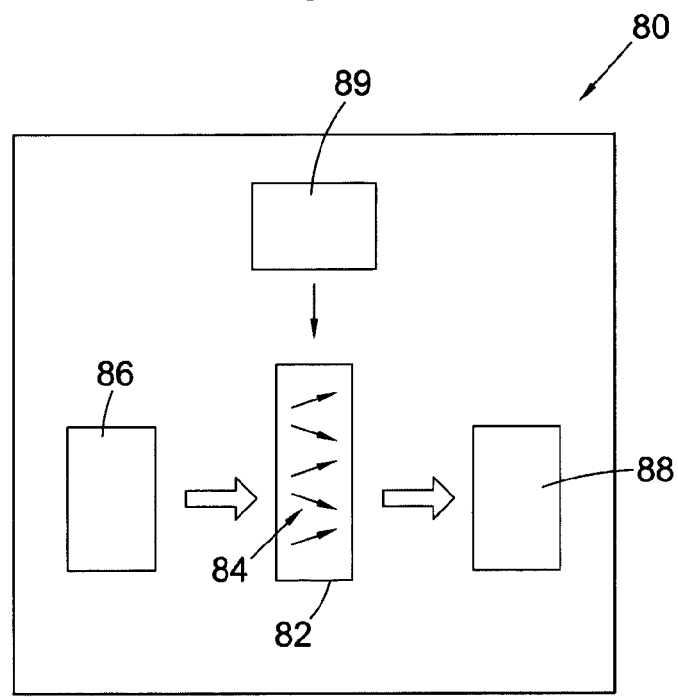
FIG. 8 shows a schematic diagram of a spin resonance device according to another embodiment of the present invention.

FIG. 8 shows another example of a diamond quantum device 80. This device includes a single crystal CVD synthetic diamond component 82 having a {110} orientation with preferentially oriented NV⁻ defects 84 and a light source 86 as previously described. The device 80 also comprises a detector 88 for detecting emission from one or more decaying quantum spin defects 84 in the single crystal CVD synthetic diamond component 82. The device 80 differs from that illustrated in FIG. 7 in that it further comprises a microwave generator 89 for manipulating one or more of the plurality of quantum spin defects in the single crystal CVD synthetic diamond layer.

In this device configuration, the diamond quantum device can function as a magnetometer, the microwave generator 89 being configured to scan a range of microwave frequencies for manipulating one or more of the plurality of quantum spin defects in the single crystal CVD synthetic diamond component 82. At a certain frequency the NV⁻ defects will undergo an electron transition from the $m_s=0$ to an $m_s=\pm 1$ state resulting in a decrease in the fluorescent emission from the NV⁻ defects. The frequency at which this transition will occur will depend on the energy level of the $m_s=\pm 1$ states which will be perturbed by an external magnetic or electric field.

As such, the frequency at which a decrease in fluorescent emission occurs can be used to measure an external magnetic or electric field.

In a modified version of the device shown in FIG. 8, the device may also comprise a static field generator to split the degeneracy of the $m_s=\pm 1$ states, the magnitude of this splitting then being perturbed by any external magnetic or electric field leading to a change in the frequency at which a decrease in fluorescent emission occur, this change corresponding to a change in magnitude and/or direction of an external magnetic or electric field.

Alternatively, the diamond quantum device illustrated in FIG. 8 may be configured to function as a quantum information processing device. In such an arrangement, the microwave generator 89 can be configured to selectively manipulate the plurality of quantum spin defects in the single crystal CVD synthetic diamond layer in order to write information to the plurality of quantum spin defect and the detector 88 can be configured to selectively address one or more of the plurality of quantum spin defects in order to read information from the plurality of quantum spin defects.

Figure 9:
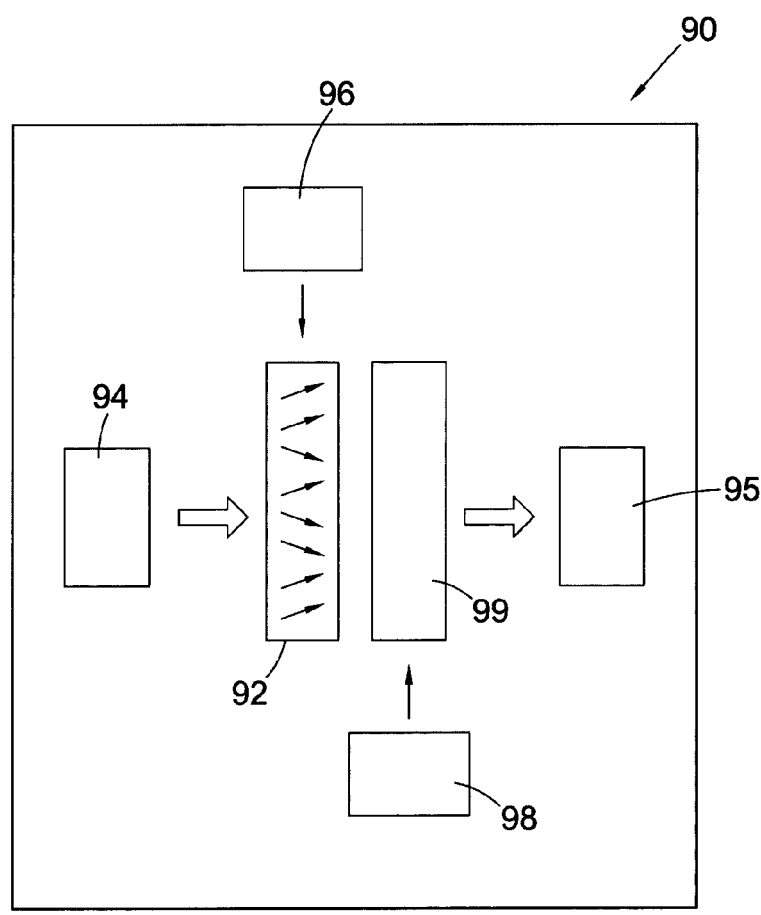
FIG. 9 shows a schematic diagram of a spin resonance device according to another embodiment of the present invention.

FIG. 9 shows another example of a diamond quantum device 90. This device includes a single crystal CVD synthetic diamond component 92 having preferentially oriented NV⁻ defects and a light source 94 as previously described. The device 90 also comprises a detector 95 for detecting emission from one or more decaying quantum spin defects in the single crystal CVD synthetic diamond component 92 and a microwave generator 96 for manipulating one or more of the plurality of quantum spin defects in the single crystal CVD synthetic diamond layer. The microwave generator 96 is configured to scan a range of microwave frequencies for manipulating one or more of the plurality of quantum spin defects in the single crystal CVD synthetic diamond layer. The device 90 further comprises a radio or microwave frequency generator 98 configured to scan a range of frequencies for manipulating quantum spins within a sample 99 disposed adjacent the single crystal CVD synthetic diamond component 92.

This device configuration can function as a spin resonance device. Such a device may also comprise a static field generator. In such an arrangement, the sample 99 is subjected to a static field, e.g. a static magnetic field. By applying a static magnetic field to the sample 99, the spins of nuclei within the sample are preferentially aligned with the applied magnetic field. An oscillating field is then applied to the sample and the frequency varied. When the oscillating field comes into resonance with a nuclear spin it flips the nuclear spin to be oriented against the direction of the static field. This transition leads to a change in the local magnetic field which can be sensed and detected. Different nuclei will spin-flip at different frequencies of the applied oscillating field due to local shielding effects of surrounding electrons and spin-spin interactions between closely spaced nuclear spins.

So far, the described device functions like a standard NMR device but with a much smaller sample volume and a much lower static field allowing the use of, for example, a small magnet (or indeed no magnet if the earth's magnetic field is used) and thus allowing miniaturization of the device as a whole. In contrast to a standard NMR device, changes in the local magnetic field resulting from nuclear spin flipping are detected using one or more quantum spin defects disposed in the single crystal CVD synthetic diamond component 92 adjacent the sample 99.

Figure 1B:
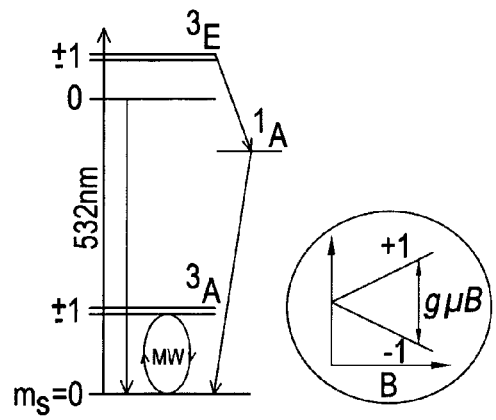
FIG. 1b illustrates the electronic structure of an $NV^-$ defect.
Figure 2A:
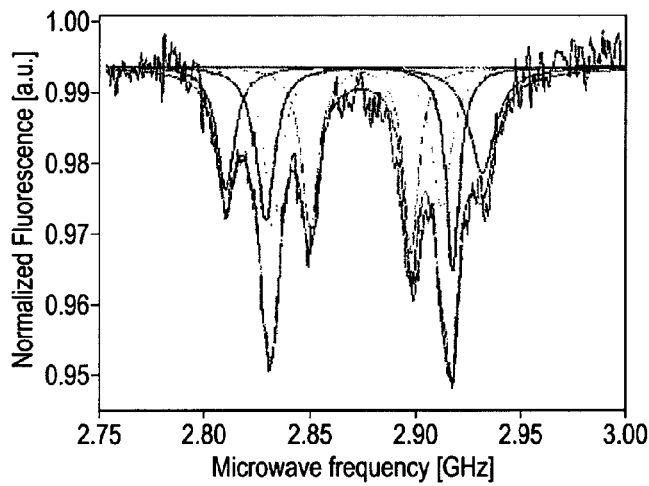
FIG. 2a illustrates a characteristic fluorescence spectrum obtained from a plurality of $NV^-$ defects manipulated by a varying microwave frequency.
Figure 2B:
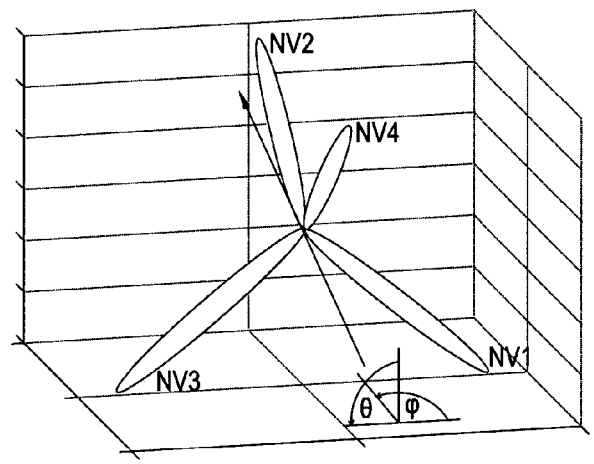
FIG. 2b illustrates the orientation of four crystallographic $NV^-$ axes in a diamond crystal.

NV⁻ defects are disposed within the previously described static magnetic field. Accordingly, the degeneracy of the electron spin states $m_s=\pm 1$ within the NV⁻ defects is split as illustrated in FIG. 1b. The NV⁻ defects are excited with an optical laser source at 532 nm causing excitation of electrons from the ³A ground state to the ³E excited state. The excited $m_s=0$ electrons fluoresce on transition back to the ground state emitting and this fluorescence is detected. An oscillating microwave field is applied to the NV⁻ defects and the frequency varied. When the oscillating microwave field comes into resonance with the electron spin of an $NV^-$ centres it causes an electron to undergo a transition to $m_s=\pm1$ state. The resonant spin transitions can be probed by sweeping the microwave (MW) frequency resulting in characteristic dips in the optically detected magnetic resonance (ODMR) spectrum as previously described by Steinert et al. with reference to FIG. 2a.

Now, the energy of the $m_s=\pm1$ state will be dependent on the static field but will be perturbed by local variations in the magnetic field caused by the nuclear spin flipping in the sample induced by the oscillating field. As such, the microwave frequency at which electron spin resonance will occur in the $NV^-$ defects will be shifted when nuclear spins in the sample come into resonance with the oscillating field. These changes are detected by a shift in the dip at which fluorescence occurs. As such, nuclear spin resonance in the sample is optically detected via changes in the electron spin resonance in the $NV^-$ defects. The optical signal can thus be processed to generate NMR data. This may be in the form of an NMR spectrum indicating chemical shift data. Alternatively, or additionally, a magnetic resonance image (MRI) can be generated for a sample if a plurality of optical readings are taken at different positions of the sample. In such a spin resonance imaging device, the detector can be configured to spatially resolve emission from the plurality of quantum spin defects in the single crystal CVD synthetic diamond component to form a spin resonance image. Alternatively, or additionally, changes in the electric field can be measured using this technique.

Data generated using the aforementioned processed may be displayed on a display screen of the device. Alternatively, data may be transmitted, either wired or wirelessly, to an external device such as a laptop or desktop computer for processing and display. In this case, the processing and display within the quantum device can be simplified and reduced in size and cost. A suitable computer program can be provided to run on a standard computer for receiving, processing and displaying data gathered by a portable quantum device.

A quantum device as previously described may be configured to be a microfluidic device comprising a microfluidic channel for receiving a fluid sample, the single crystal CVD synthetic diamond layer being located adjacent the microfluidic channel. In such an arrangement, the microfluidic channel and the single crystal CVD synthetic diamond layer acting as a quantum sensor can be integrated into a microfluidic cell such as that illustrated in FIG. 10.

Figure 10:
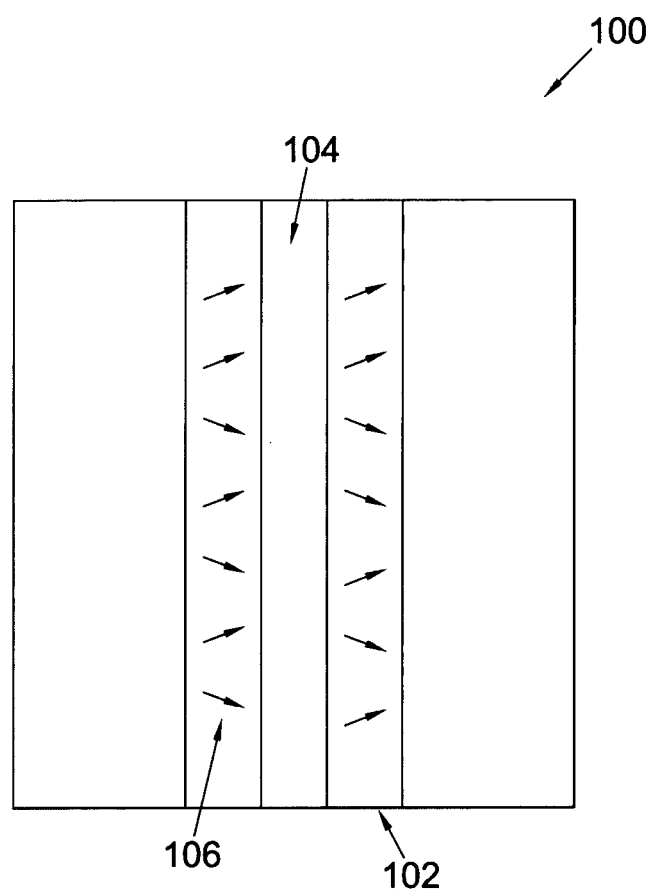
FIG. 10 shows a schematic diagram of a microfluidic cell comprising a {110} oriented layer of single crystal CVD synthetic diamond material for use in a diamond quantum device according to an embodiment of the present invention.

FIG. 10 shows an example of a diamond based microfluidic cell 100. The microfluidic cell 100 comprises at least one diamond sensor 102 positioned adjacent a channel 104 into which a fluid sample can be disposed. The at least one diamond sensor 102 comprises one or more quantum spin defects 106 consisting of preferentially oriented $NV^-$ defects as previously described, which are positioned adjacent the channel 104 to sense changes in the magnetic and/or electric field within a sample located in the channel 104. The illustrated arrangement comprises two diamond sensing elements 102 placed on opposite sides of the channel 104. However, it is envisaged that the microfluidic cell may comprise only one or alternatively a plurality of diamond sensing elements.

The micro fluidic channel preferably has at least one dimension equal to or less than 1 mm, more particularly in the range 100 nm to 1 mm, optionally in the range 500 nm to 500 µm. The size of the microfluidic channel may be chosen to be selective of certain species. More than one channel may be provided. The different channels may have different sizes to be selective of different species based on differences in the size of the species.

Figure 11:
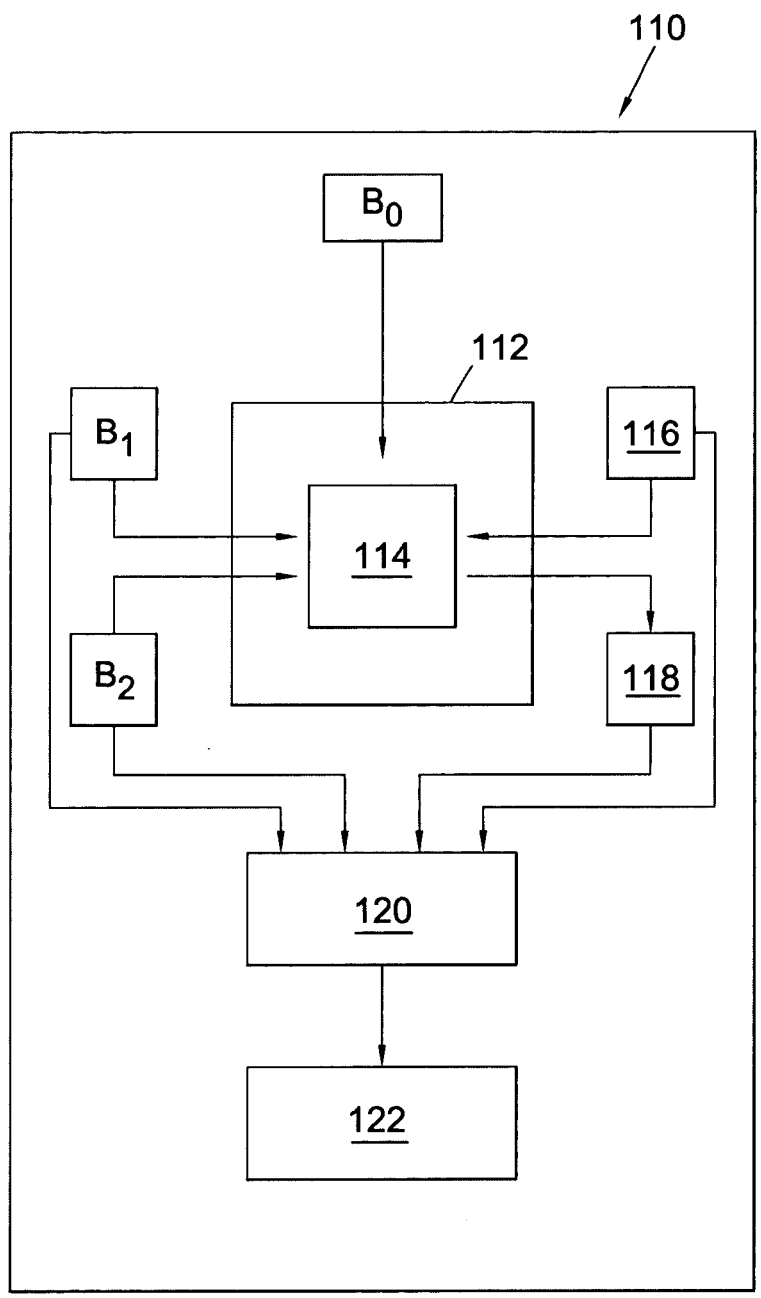
FIG. 11 shows a schematic diagram of a spin resonance device for use with a microfluidic cell such as that illustrated in FIG. 10.

FIG. 11 shows a spin resonance device 110 for use with a microfluidic cell such as that shown in FIG. 10. The device 110 comprises a static magnetic field generator ($B_0$), a first variable oscillating magnetic field generator ($B_1$) and a second variable oscillating magnetic field generator ($B_2$). The first variable oscillating magnetic field generator ($B_1$) is preferably a radio frequency generator and the second oscillating variable magnetic field generator ($B_2$) is preferably a microwave generator. The device may further comprise magnetic shielding 112 disposed around a cell receiving bay 114. In one arrangement the earth's magnetic field is used as a static magnetic field and thus no additional static magnetic field generator is required. In such an arrangement, the shielding may be adapted to shield the sensor from any external oscillating fields but not against a static magnetic field. Such shielding is known to those skilled in the art. The spin resonance device also comprises a light source 116 configured to excite quantum spin defects in a diamond based microfluidic cell mounted in the cell receiving bay 114 and an optical detector 118 for detecting optical output signals from the quantum spin defects in the diamond based microfluidic cell. The light source may be a laser light source. The light source may be configured to selectively excite quantum spin defects at different positions along the micro fluidic channel to allow analysis of fluid at different positions along the channel. Alternatively or additionally, the detector may be configured to selectively detect emission from quantum spin defects at different positions along the micro fluidic channel to allow analysis of fluid at different positions along the channel.

In an alternative arrangement, the previously described magnetic field generators may be replaced with electric field generators. The electronic structure of the $NV^-$ defect is such that embodiments of the present invention can also be used to measure electric fields as an alternative to, or in addition to, magnetic fields.

One or more processors 120 may be disposed within the spin resonance device and linked to the detector 118 to receive and process emission data. The one or more processors 120 may be linked to an output 122 for outputting results. The output 122 may comprise a display screen for displaying spin resonance data. The one or more processors 120 and the display 122 may be integrated into the spin resonance device. Alternatively, or additionally, the output 122 may be adapted for transmitting data to an external device such as a laptop or desktop computer for processing and displaying data.

Such a device can function as previously described in relation to FIG. 9. As an alternative, or in addition to, the use of high purity quantum grade single crystal diamond material to improve the decoherence time of the one or more quantum spin defects within the diamond material, a suitable pulse sequence may be selected and utilized to increase decoherence time. As such, the devices previously described may be configured to impart a pulsed signal to the one or more quantum spin defects to increase decoherence time and thus improve sensitivity. A typical pulse sequence would comprise a $\pi/2$ pulse followed by a $\pi$ pulse followed by another $\pi/2$ pulse.

Synthesis Example

A synthetic type Ib HPHT diamond plate with a pair of approximately parallel major faces within approximately 5° of (001) was selected. The plate was fabricated into a square substrate suitable for homoepitaxial synthesis of single crystal CVD diamond material by a process including the following steps:

i) laser cutting of the substrate to produce a plate with all <100> edges;

ii) lapping and polishing the major surface upon which growth is to occur, the lapped and polished part having dimensions about 4.0 mm×4.0 mm by 300 μm thick, with all faces {100}. The defect level at or below the substrate surface is minimised by careful preparation of the substrate as disclosed in EP 1 292 726 and EP 1 290 251. It is possible to reveal the defect levels being introduced by this processing by using a revealing plasma etch. It is possible routinely to produce substrates in which the density of defects measurable after a revealing etch is dependent primarily on the material quality and is below $5 \times 10^3$ mm$^{-2}$, and generally below $10^2$ mm$^{-2}$. The surface roughness at this stage was less than 10 nm over a measured area of at least 50 μm×50 μm. The substrate was mounted onto a substrate carrier using a high temperature diamond material braze. The substrate and its carrier were then introduced into a CVD reactor chamber and an etch and growth cycle commenced by feeding gasses into the chamber as follows.

First, an in situ oxygen plasma etch was performed using 50/25/3000 sccm (standard cubic centimeter per second) of $O_2/Ar/H_2$ at a pressure of 180 Torr and a substrate temperature of 840° C., followed by a hydrogen etch, oxygen being removed from the gas flow at this stage. Then the first stage growth process was started by the addition of methane at 160 sccm. Nitrogen was added to achieve a level of 800 ppb in the gas phase. Hydrogen was also present in the process gas. The substrate temperature at this stage was 857° C. These growth conditions were selected to give an α parameter value in the range of 2.0±0.2, based on previous test runs and confirmed retrospectively by crystallographic examination. On completion of the growth period, the substrate was removed from the reactor and the CVD diamond layer removed from the substrate by laser sawing and mechanical polishing techniques.

Study of the grown CVD diamond plate revealed that it was free of twins and cracks on the (001) face, and bounded by <110> sides and post-synthesis dimensions of the twin free top (001) face were increased to 8.7 mm×8.7 mm.

This block was then subsequently processed, using the same techniques described previously (cutting, lapping, polishing and etching) for the production of the Ib HPHT plate, to produce a plate with a major face (110) and a well-prepared surface with dimensions 3.8×3.2 mm and 200 μm thick. This was then mounted and grown on using identical conditions to that described above with the exception that during the synthesis stage, the substrate temperature was 800° C. and nitrogen was not introduced as a dopant gas. This produced a CVD sample with a (110) major face and the CVD block had typical dimensions of 4.5×4.5 mm and 3.0 mm thickness.

This second grown CVD layer was subsequently processed and removed from the previously prepared CVD substrate. Ensemble EPR analysis showed that nitrogen was predominately incorporated into CVD diamond as $N_S$ rather than as a NV defects. The measured concentration of $N_S$ was 3 ppb.

Single NV centres were resolved in scanning confocal images. In order to determine NV orientation, images were obtained for nine different linear excitation polarizations. If the surface normal is defined as [110], the linear polarization is varied from 0 to 160 degrees in equal steps with polarization angle 0 corresponding to [001]. The excitation polarization dependence can be used to distinguish between different NV orientations. Analysis of over 600 single NV centres indicated that the preferential grown-in NV defects accounted for >99.7% of all NVs. This is consistent with the following numerical analysis.

If we define the preferred orientation, P %, is defined as follows:

$$P = \frac{mq - \frac{m}{n}}{1 - \frac{m}{n}}, \text{ or } P = \frac{q - \frac{1}{n}}{\frac{1}{m} - \frac{1}{n}}$$

where n is the number of statistically equivalent sites according to the symmetry of the underlying lattice, q is the % of all defects lying in a particular orientation, where that orientation is one of the subset of orientations showing the highest % of defects aligned along it, and m is the number of defects in this subset which is symmetry related under the symmetry imposed by the cause of the preferred orientation. Thus P=0% when the distribution is random, and 100% when the defects are all aligned along orientations in the subset of orientations which are symmetry related under the symmetry imposed by the cause of the preferred orientation.

We can calculate the % of preferential orientation alignment, where we make the asumption the actual symmetry of the distribution is no lower than the symmetry of the measurements made to date (a below)

a) Assuming preferential orientation alignment to <111> orientations lying off the (110) growth plane, but that there is no differentiation between pointing out of the plane in a +ve or −ve direction relative to the growth direction (resolving onto the +ve or −ve plane normal), then the preferential orientation alignment, P, is given by:

$$P = \frac{0.997/4 - \frac{1}{8}}{\frac{1}{2} - \frac{1}{8}} \Rightarrow 33.1\% \text{ preferential orientation alignment to } \langle 111 \rangle$$

orientations lying off the (110) growth plane, and pointing out of the plane.

Note that should theoretical justification be found as to why there should be no differentiation between configurations pointing out of the plane in a +ve or −ve direction relative to the growth direction (resolving onto the +ve or −ve plane normal), then the preferential orientation alignment, P, is given by:

$$P = \frac{0.997/4 - \frac{1}{8}}{\frac{1}{4} - \frac{1}{8}} \Rightarrow 99.4\% \text{ preferential orientation alignment to } \langle 111 \rangle$$

orientations lying off the (110) growth plane.

While this invention has been particularly shown and described with reference to preferred embodiments, it will be understood to those skilled in the art that various changes in form and detail may be made without departing from the scope of the invention as defined by the appendant claims.

The invention claimed is:

1. A single crystal synthetic CVD diamond material comprising:
   a growth sector; and
   a plurality of point defects of one or more type within the growth sector,
   wherein at least one type of point defect is preferentially aligned within the growth sector,
   wherein at least 60% of said at least one type of point defect shows said preferential alignment, and
   wherein the at least one type of point defect is a negatively charged nitrogen-vacancy defect (NV⁻).

2. A single crystal synthetic CVD diamond material according to claim 1, wherein at least 65%, 70%, 75%, 80%, 85%, 90%, 95%, 98%, or 99% of said at least one type of point defect shows said preferential alignment.

3. A single crystal synthetic CVD diamond material according to claim 1, wherein said preferential alignment is out-of-plane with respect to a {110}, {111}, or {113} crystallographic plane, preferably the {110} crystallographic plane.

4. A single crystal synthetic CVD diamond material according to claim 1, wherein said preferential alignment is in a <111> direction out-of-plane with respect to a {110} crystallographic plane.

5. A single crystal synthetic CVD diamond material according to claim 1, wherein the preferentially aligned point defects lie in a {110}, {111}, or {113} growth sector of the single crystal synthetic CVD diamond material, preferably a {110} growth sector.

6. A single crystal synthetic CVD diamond material according to claim 1, wherein the preferentially aligned point defects lie within 100 μm of an external surface of the single crystal synthetic CVD diamond material, said external surface being a {110}, {111}, or {113} surface, preferably a {110} surface.

7. A single crystal synthetic CVD diamond material according to claim 1, wherein the preferentially aligned point defects lie in a {100} growth sector of the single crystal synthetic CVD diamond material.

8. A single crystal synthetic CVD diamond material according to claim 1, wherein the preferential alignment is out-of-plane with respect to a {100} crystallographic plane.

9. A single crystal synthetic CVD diamond material according to claim 1, wherein the preferentially aligned point defects lie within 100 μm of an external surface of the single crystal synthetic CVD diamond material, said external surface being a {100} surface.

10. A single crystal synthetic CVD diamond material according to claim 1, wherein the single crystal CVD synthetic diamond layer has one or more of: a neutral single substitutional nitrogen concentration equal to or less than 20 ppb, 10 ppb, 5 ppb, 1 ppb or 0.5 ppb; an NV⁻ concentration equal to or less than 0.15 ppb, 0.1 ppb, 0.05 ppb, 0.001 ppb, 0.0001 ppb or 0.00005 ppb or an NV⁻ concentration equal to or greater than 0.1 ppm, 0.5 ppm, 1.0 ppm, 2.0 ppm, 3 ppm, 4 ppm or 5 ppm; and a total concentration of $^{13}$C equal to or less than 0.9%, 0.7%, 0.4% 0.1%, 0.01%, or 0.001%.

11. A single crystal synthetic CVD diamond material according to claim 1, wherein the at least one type of point defect has a decoherence time $T_2$ equal to or greater than 0.05 ms, 0.1 ms, 0.3 ms, 0.6 ms, 1 ms, 5 ms, or 15 ms, with corresponding $T_2^*$ values equal to or less than 800 μs, 600 μs, 400 μs, 200 μs, 150 μs, 100 μs, 75 μs, 50 μs, 20 μs, or 1 μs.

12. A single crystal synthetic CVD diamond material according to claim 1, wherein the single crystal synthetic CVD diamond material has at least one dimension equal to or greater than 0.1 mm, 0.5 mm, 1 mm, 2 mm, or 3 mm.

13. A single crystal synthetic CVD diamond material according to claim 1, wherein the single crystal synthetic CVD diamond material forms a layer having a thickness equal to or greater than 0.1 μm, 1 μm, 10 μm, 100 μm, 200 μm, or 500 μm.

14. A device component comprising a single crystal synthetic CVD diamond material according to claim 1.

15. A device component according to claim 14, wherein an out-coupling structure is formed at a surface of the single crystal synthetic CVD diamond material for increasing out-coupling of light, said at least one type of point defect being preferentially aligned relative to said out-coupling structure.

16. A device comprising:
   a device component according to claim 14; and
   a light source for optically pumping one or more of the plurality of point defects in the single crystal synthetic CVD diamond material, said at least one type of point defect being preferentially aligned relative to said light source.

* * * * *